US010763306B2

(12) United States Patent
Tseng et al.

(10) Patent No.: US 10,763,306 B2
(45) Date of Patent: Sep. 1, 2020

(54) RESISTIVE MEMORY AND METHOD FOR FABRICATING THE SAME AND APPLICATIONS THEREOF

(71) Applicant: MACRONIX INTERNATIONAL CO., LTD., Hsinchu (TW)

(72) Inventors: Po-Hao Tseng, Taichung (TW); Dai-Ying Lee, Hsinchu County (TW); Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/515,180

(22) Filed: Jul. 18, 2019

(65) Prior Publication Data

US 2019/0341426 A1   Nov. 7, 2019

Related U.S. Application Data

(62) Division of application No. 15/291,203, filed on Oct. 12, 2016, now Pat. No. 10,388,698.

(30) Foreign Application Priority Data

May 30, 2016   (TW) .............................. 105116939 A

(51) Int. Cl.
*H01L 27/24*   (2006.01)
*H01L 45/00*   (2006.01)
*H01L 29/417*   (2006.01)

(52) U.S. Cl.
CPC .... *H01L 27/2436* (2013.01); *H01L 29/41766* (2013.01); *H01L 45/122* (2013.01);
(Continued)

(58) Field of Classification Search
CPC ... H01L 27/2436; H01L 45/04; H01L 45/146; H01L 45/1233; H01L 45/145; H01L 29/41766; H01L 45/1608; H01L 29/66727
(Continued)

(56) References Cited

U.S. PATENT DOCUMENTS 6,020,254 A * 2/2000 Taguwa ............ H01L 21/02063
                                                   438/618
6,162,669 A   12/2000 Horita et al.
(Continued)

FOREIGN PATENT DOCUMENTS

| CN | 104810474 A | 7/2015 |
| CN | 105097864 A | 11/2015 |
| TW | I508340 B | 11/2015 |

OTHER PUBLICATIONS

CN Office Action dated Nov. 1, 2019 in Chinese application (No. 201610856477.9).
(Continued)

*Primary Examiner* — David Chen
(74) *Attorney, Agent, or Firm* — McClure, Qualey & Rodack, LLP

(57) ABSTRACT

A resistive memory includes a semiconductor substrate, a dielectric layer, an insulating layer and a metal electrode layer. The semiconductor substrate has a top surface and a recess extending downwards into the semiconductor substrate from the top surface. The dielectric layer is disposed on the semiconductor substrate and has a first through-hole aligning the recess. The insulating layer is disposed in the first through-hole and the recess. The metal electrode layer is disposed on the insulating layer by which the metal electrode layer is isolated from the semiconductor substrate.

7 Claims, 8 Drawing Sheets

(52) U.S. Cl.
CPC ...... *H01L 45/1233* (2013.01); *H01L 45/1273* (2013.01); *H01L 45/145* (2013.01); *H01L 45/146* (2013.01); *H01L 45/16* (2013.01); *H01L 45/1608* (2013.01)

(58) Field of Classification Search
USPC ............ 438/104, 197, 589, 740; 257/2, 296, 257/E21.577, E29.066, E29.259
See application file for complete search history.

(56) References Cited

U.S. PATENT DOCUMENTS

| | | | |
|---|---|---|---|
| 6,452,229 | B1 | 9/2002 | Krivokapic |
| 9,117,750 | B2 | 8/2015 | Lin |
| 9,287,324 | B2 | 3/2016 | Lin |
| 2007/0254428 | A1 | 11/2007 | Willer et al. |
| 2009/0323387 | A1 | 12/2009 | Lin et al. |
| 2010/0035423 | A1 | 2/2010 | Clark |
| 2011/0026297 | A1 | 2/2011 | Lin et al. |
| 2011/0084320 | A1* | 4/2011 | Jung ................ H01L 21/76834 257/288 |
| 2014/0091371 | A1* | 4/2014 | Son ........................ H01L 29/78 257/288 |
| 2015/0200363 | A1 | 7/2015 | Sacchetto et al. |
| 2015/0206924 | A1* | 7/2015 | Lin ..................... H01L 27/2463 257/2 |
| 2015/0262864 | A1 | 9/2015 | Okamoto et al. |
| 2016/0071980 | A1 | 3/2016 | Chang et al. |

OTHER PUBLICATIONS

Chien, et al.: "A Forming-free WOX Resistive Memory Using a Novel Self-aligned Field Enhancement Feature with Excellent Reliability and Scalability"; 978-1-4244-7419-6/10/$26.00 © 2010 IEEE; pp. 19.2.1-19.2.4.

Ninomiya, et al.: "Conductive Filament Scaling of TaOx Bipolar ReRAM for Long Retention ith Low Current Operation"; 2012 Symposium on VLSI Technology Digest of Technical Papers; pp. 73-74.

Tseng, et al.: "Electron Trapping Effect on the Switching Behavior of Contact RRAM Devices through Random Telegraph Noise Analysis"; 978-1-4244-7419-6/10/$26.00 © 2010 IEEE; pp. 28.5.1-28.5.4.

Tseng, et al.: "High Density and Ultra Small Cell Size of Contact ReRAM (CR-RAM) in 90nm CMOS Logic Technology and Circuits"; 97-4244-5640-6/09/$26.00 © 2009 IEEE; pp. 5.6.1-5.6.4.

"Panasonic first with mass-produced ReRAM computer"; Published on Jul. 31, 2013 by Gareth Halfacree; pp. 1-2; http://www.bit-tech.net/news/hardware/2013/07/31/panasonic-reram/1.

TIPO Office Action dated Apr. 28, 2017 in corresponding Taiwan application (No. 105116939).

* cited by examiner

RESISTIVE MEMORY AND METHOD FOR FABRICATING THE SAME AND APPLICATIONS THEREOF

This application is a divisional application of U.S. patent application Ser. No. 15/291,203, filed on Oct. 12, 2016, now U.S. Pat. No. 10,388,698, which claims the benefit of Taiwan application Ser. No. 105116939, filed May 30, 2016, the subject matter of which is incorporated herein by reference.

BACKGROUND

Technical Field

The disclosure in generally relates to a non-volatile memory (NVM) device, a method for fabricating the same and the applications thereof, and more particularly to a resistive memory device, a method for fabricating the same and the applications thereof.

Description of the Related Art

NVMs which are able to continually store information even when the supply of electricity is removed from the device containing the NVM cells. Recently, the most widespread used NVMs are charge trap flash (CTF) memory devices. However, as semiconductor features shrink in size and pitch, the CTF memory devices have its physical limitation of operation. In order to solve the problems, resistive memory devices are thus provided.

Resistive memory devices, such as resistive random-access memory (ReRAM) devices, that apply difference of resistance within the memory cells thereof to implementing the erase/program operation have advantages in terms of cell area, device density, power consumption, programming/erasing speed, three-dimensional integration, multi-value implementation, and the like over flash memory devices, and thus have become a most promising candidate for leading products in the future memory market.

A typical ReRAM device comprises a vertical arrangement of metal layer/memory layer/metal layer (MIM) structure. As a result, the ReRAM device can achieve high-density storage by means of a crossbar array configuration. In order to improve the assembly of a substrate and the metal layer, a prior art method for fabricating a ReRAM device comprises steps as follows: A recess is firstly formed on the substrate, and a barrier layer is then formed on the bottom and the sidewalls of the recess. A metal material, such as tungsten (W) is next filled into the recess to form a lower electrode layer. A metal oxide layer serving as the memory layer is subsequently formed on a top surface of the lower electrode layer by an oxidation process or a deposition process. Thereafter, an upper electrode layer is formed on the metal oxide layer.

In addition, for the purpose of avoiding current leakage, an additional photolithography/etching process is required for patterning the metal oxide layer and the upper electrode layer, during the fabricating process, to make the metal oxide layer entirely covering the lower electrode layer and to prevent the upper electrode layer electrically in contact with the lower electrode layer. However, by this conventional approach, the metal oxide layer and the upper electrode layer cannot be scaled down proportionally with the critical dimension shrinkage of the other semiconductor elements within the same ReRAM device. As a result, it is hard to meet the current trend to minimize the size of semiconductor devices.

Therefore, there is a need of providing an improved resistive memory device, an improved method for fabricating the same and the applications thereof to obviate the drawbacks encountered from the prior art.

SUMMARY

One aspect of the present disclosure is to provide a resistive memory device, wherein the resistive memory device includes a semiconductor substrate, a dielectric layer, a metal oxide layer and a metal electrode layer. The semiconductor substrate has a top surface and a recess extending downwards into the semiconductor substrate from the top surface. The dielectric layer is disposed on the semiconductor substrate and has a first through-hole aligning the recess. The metal oxide layer is disposed both on a sidewall of the first through-hole and the recess. The metal electrode layer is disposed on the metal oxide layer by which the metal electrode layer is isolated from the semiconductor substrate.

Another aspect of the present disclosure is to provide a ReRAM device, wherein the ReRAM device includes a semiconductor substrate, a gate structure, a drain, a source, a dielectric layer, an insulating layer and a metal electrode layer. The semiconductor substrate has a top surface. The gate structure is disposed on the top surface. The drain is formed in the semiconductor substrate adjacent to the gate structure and has a recess extending downwards into the drain from the top surface. The source is formed in the semiconductor substrate, adjacent to the gate structure and separated from the drain. The dielectric layer is disposed on the semiconductor substrate and has a first through-hole aligning the recess. The insulating layer is disposed both on a sidewall of the first through-hole and the recess. The metal electrode layer is disposed on the insulating layer by which the metal electrode layer is isolated from the semiconductor substrate.

Yet another aspect of the present disclosure is to provide a method for fabricating a resistive memory device, wherein the method includes steps as follows: A semiconductor substrate having a gate structure, a first doping region and a second doping region is provided, wherein the gate structure is formed on a top surface of the substrate; the first doping region and the second doping region are formed in the substrate, adjacent to the gate structure and separated from each other. Next, a dielectric layer is then formed on the top surface to cover on the first doping region and the second doping region. A first etching process is then performed to form a first through-hole in the dielectric layer, so as to expose a portion of the first doping region, meanwhile, to form a recess extending downwards into the first doping region from the top surface. Then, an insulating layer and a metal electrode layer are formed sequentially in the first through-hole and the recess to make the metal electrode being isolated from the first doping region by the insulating layer. Subsequently, a second etching process is performed to form a second through hole in the dielectric layer to expose a portion of the second doping region, and a via plug electrically contact to the second doping region is then formed in the second through-hole.

In accordance with the aforementioned embodiments of the present disclosure, a resistive memory device, the method for fabricating the same and the applications thereof are provided. A dielectric having a through hole is firstly formed on a top surface of a semiconductor substrate, wherein a portion of the top surface is exposed from the through hole. A recess is then formed on the exposed portion of the top surface and extending downwards into the semiconductor substrate. Next, a self-aligned structure including an insulating layer and a metal electrode layer formed sequentially in the through hole and the recess, whereby a memory cell having a metal-insulator-semiconductor (MIS) vertical stack structure constituted by the underlying semiconductor device, the insulating layer and the top metal electrode layer is then implemented.

Since the forming of the insulating layer/metal electrode layer self-aligned stacking structure does not require an additional photolithography/etching process for patterning the same, thus the memory cell can be scaled down proportionally with the critical dimension shrinkage of the other semiconductor elements within the same resistive memory device, so as to meet the current trend to minimize the size of semiconductor devices. In addition, because the insulating layer extends downwards into the recess to form a corner beak in the semiconductor substrate, the program/erase speed of the memory cell can be accelerated by corner effect resulted from the corner beak of the insulating layer formed in the edge of the recess. The performance of the resistive memory device can be significantly improved.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
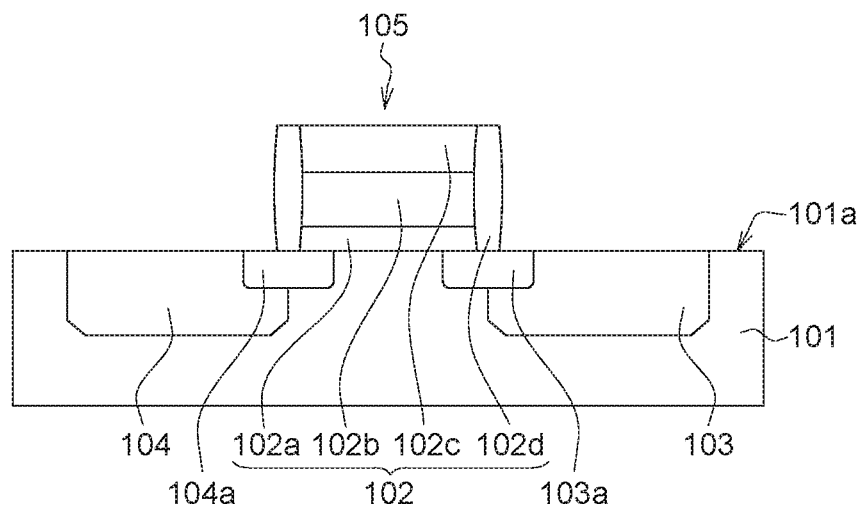
FIGS. 1A to 1H are cross-sectional views illustrating a series of processing structures for fabricating a resistive memory device in accordance with one embodiment of the present invention.
Figure 1B:
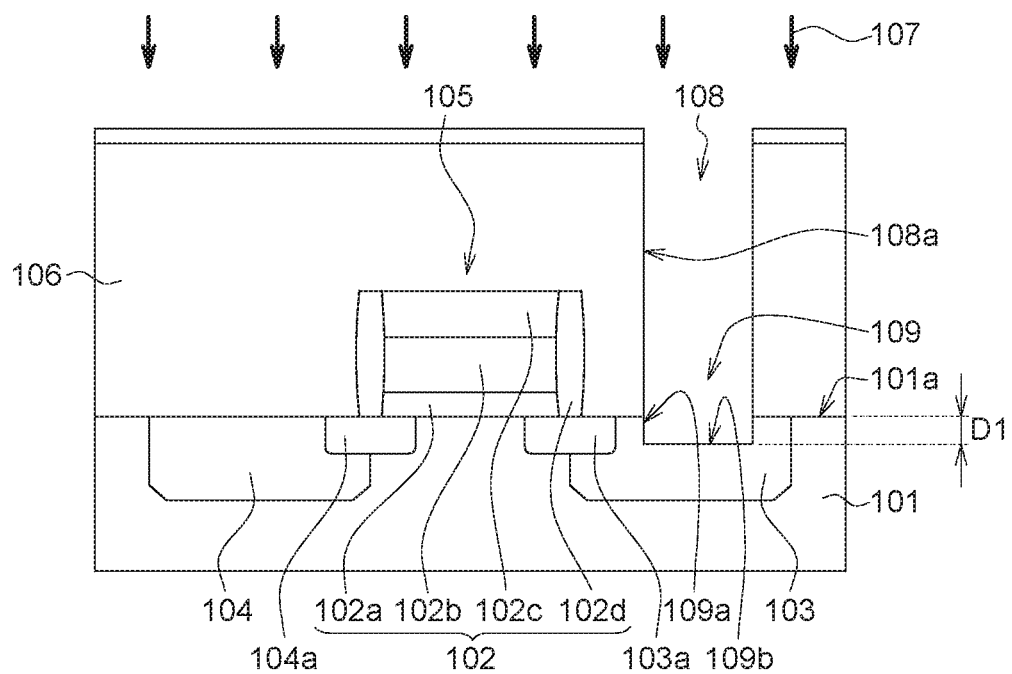

The embodiments as illustrated below provide a resistive memory device, an improved method for fabricating the same and the applications thereof to solve the problems of device minimization and to improve the performance thereof. The present invention will now be described more specifically with reference to the following embodiments illustrating the structure and arrangements thereof.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

FIGS. 1A to 1H are cross-sectional views illustrating a series of processing structure for fabricating a resistive memory device 100 in accordance with one embodiment of the present invention. In some embodiments of the present disclosure, the resistive memory device 100 can be a ReRAM. The process for fabricating the resistive memory device 100 includes steps as follows:

A semiconductor substrate 101 is firstly provided. In some embodiments of the present disclosure, the semiconductor substrate 101 may be a bulk structure including un-doped poly-silicon, doped poly-silicon (with n-type or p-type dopants) or other elemental semiconductor, such as crystal germanium (Ge), compound semiconductor, such as silicon carbide (SiC), gallium arsenide (GaAs), gallium phosphide (GaP), iodine phosphide (IP), arsenic iodine (AsI) or antimony iodide (SbI), or the arbitrary combinations thereof. In the present embodiment, the semiconductor substrate 101 is a wafer including poly-silicon.

Next, a gate structure 102 is formed on a top surface 101a of the semiconductor substrate 101. At least one ion implantation process is then performed on the surface 101a to form a first doping region 103 and a second doping region 104 extending downwards into the semiconductor substrate 101, wherein the first doping region 103 and the second doping region 104 are disposed adjacent to the gate structure 102 and separated from each other (see FIG. 1A).

In the present embodiment, the gate structure 102 includes a stack of a gate dielectric layer 102a, a gate electrode 102b and a gate silicide layer 102c formed in sequence on the top surface 101a of the semiconductor substrate 101, as well as a spacer 102d formed on the sidewalls of the stack. The first doping region 103 and the second doping region 104 that are disposed adjacent to the gate structure 102 have an n-type conductivity. A transistor 105 is thus formed by the gate structure 102, the first doping region 103 and the second doping region 104, wherein the first doping region 103 and the second doping region 104 can respectively serve as a drain and source of the transistor 105.

In some embodiments of the present disclosure, another ion implantation process may be performed, prior to the forming of the first doping region 103 and the second doping region 104, to form a lightly-doped drains (LDDs) 103a and 104a in the semiconductor substrate 101 by using the gate structure 102 as a mask. In the present embodiment, the LDD 103a is formed between the gate structure 102 and the first doping region 103; and the LDD 104a is formed between the gate structure 102 and the second doping region 104.

A dielectric layer 106 is then formed on the top surface 101a of the substrate 101 to cover the gate structure 102, the first doping region 103 and the second doping region 104. Thereafter, a first etching process 107 is performed to form a first through hole 108 penetrating through the dielectric layer 106, so as to expose a portion of the first doping region 103. Meanwhile, a recess 109 extending downwards into the first doping region 103 from the top surface 101a of the semiconductor substrate 101 can be formed by the over etch of the first etching process 107 (see FIG. 1B).

In some embodiments of the present disclosure, the dielectric layer 106 may be an interlayer dielectric (ILD) formed by a deposition process, such as a low pressure chemical vapor deposition (LPCVD) process, or other suitable process. The dielectric layer 106 may be made of material selected from a group consisting of silicon oxide, silicon nitride, silicon oxynitride, silicon-oxycarbide and the arbitrary combinations thereof, or made of other suitable dielectric materials.

In some embodiments of the present disclosure, the first etching process 107 can be a dry etch, such as a reactive ion etch (RIE) using the top surface 101a of the semiconductor substrate 101 as the etching stop layer. Since the first through hole 108 and the recess 109 are both formed from the first etching process 107, thus the recess aligns to the first through hole 108. The recess 109 has a depth D1 measured from the top surface 101a of the semiconductor substrate 101 to the bottom 109b of the recess 109 ranging from 5 nm to 15 nm. Of note that, the recess 109 neither vertically nor laterally extends beyond the first doping region 103. In other words, the recess 109 is surrounded by the first doping region 103.

Figure 1C:
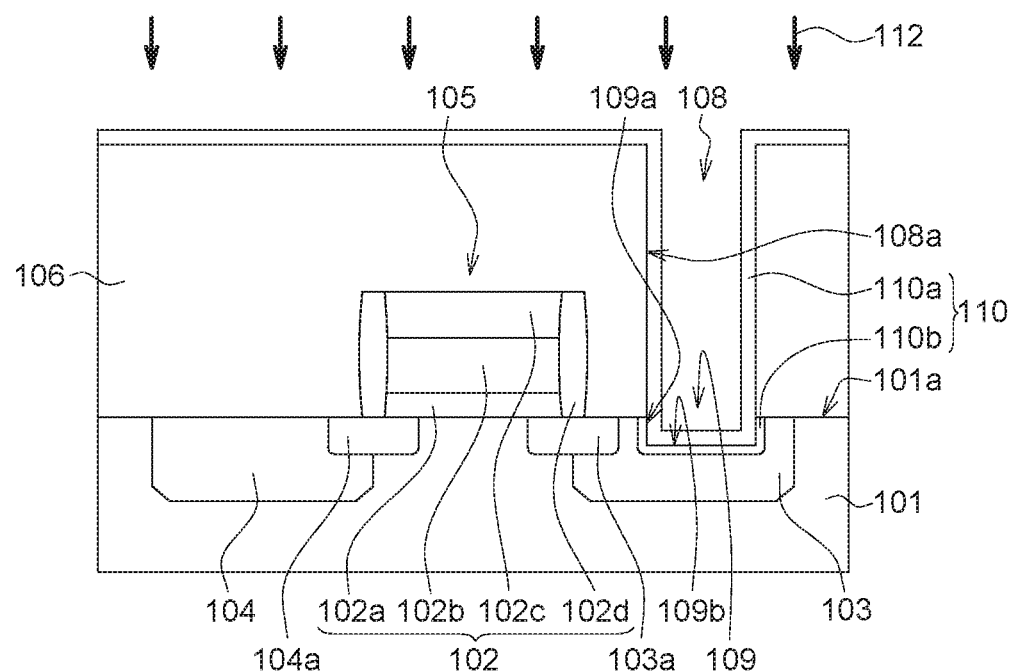

After the forming of the first through hole 108 and the recess 109, an insulating layer 110 is formed in the first through hole 108 and the recess 109 (see FIG. 1C). The method for forming the insulating layer 110 includes steps as follows: A metal layer with a thickness ranging from 5 nm to 10 nm (not shown) is firstly formed on the dielectric layer 106, the sidewalls 108a of the first through hole 108, the sidewalls 109a of the recess 109 and the bottom 109b of the recess 109. A plasma oxidation process 112 is then performed to transform the metal layer into a metal oxide layer 110a.

In some embodiments of the present disclosure, the plasma oxidation process 112 may be carried out in an oxygen-containing atmosphere with a bias ranging from 10V to 50V and a radio frequency (RF) power ranging from and 100 W to 300 W for a process time ranging from 5 second(s) to 30 s. The metal oxide layer 110a can be made of hafnium oxide ($HfO_2$), titanium oxide ($TiO_x$), titanium oxy nitride (TiON), tantalum oxide ($Ta_2O_5$), tungsten silicon oxide (WSiO) or the arbitrary combinations thereof.

However, in the case, when the bias of the plasma oxidation process 112 is substantially greater than 100V, a portion of the first doping region 103 used to define the recess 109 may be oxidized to form a silicon oxide layer 110b on the sidewalls 109a and the bottom 109b of the recess 109 and connecting the first doping region 103 with the metal oxide layer 110a. The combination of the metal oxide layer 110a and the silicon oxide layer 110b constitutes the insulating layer 110. In the present embodiment, the plasma oxidation process 112 may be performed by applying a bias ranging from 100V to 180V and a RF power ranging from and 100 W to 300 W for a process time ranging from 5 s to 30 s.

Figure 1D:
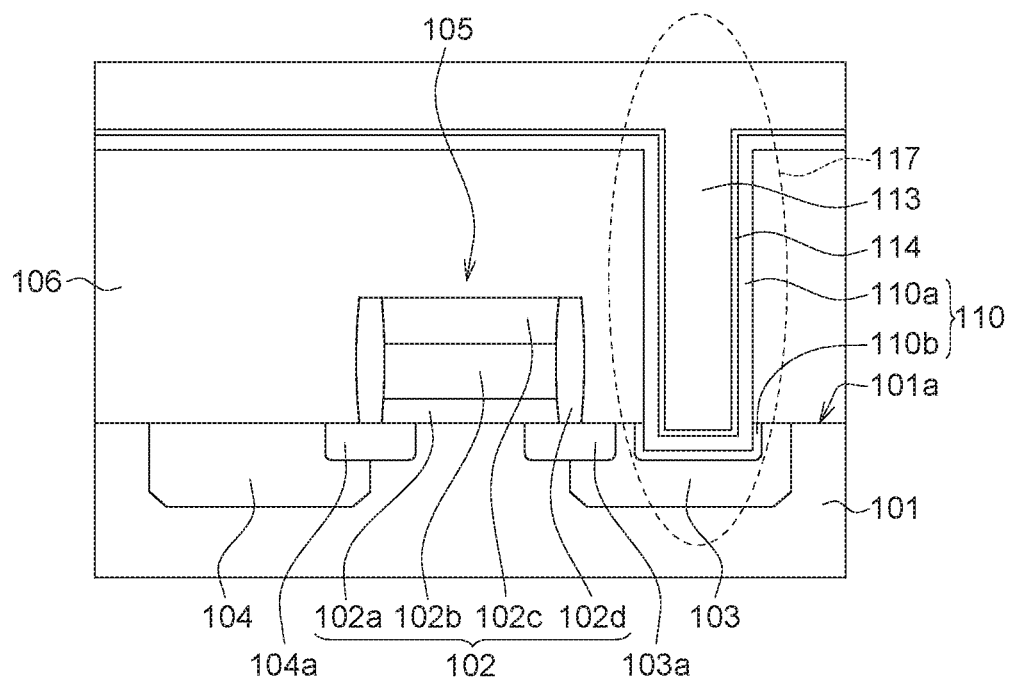
Figure 1E:
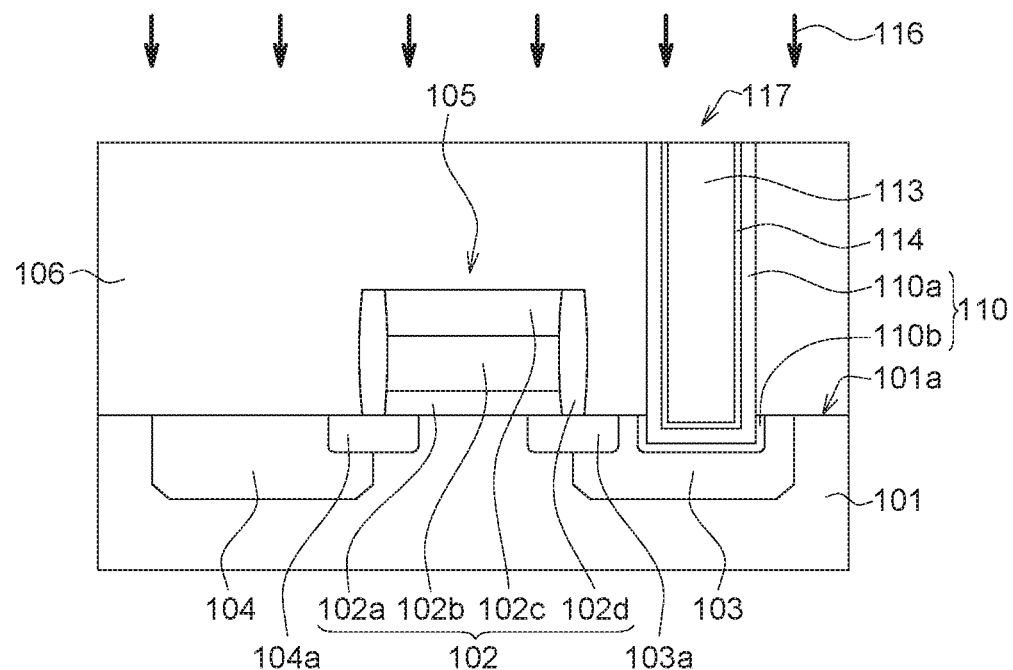

Subsequently, a metal electrode layer 113 is formed on the insulating layer 110 by a deposition process, such as a LPCVD process, to fill the first through hole 108 and the recess 109, and to make the metal electrode layer 113 being isolated from the first doping region 103 by the insulating layer 110 (see FIG. 1D). In some embodiments of the present disclosure, the metal electrode layer 113 may be made of copper (Cu), aluminum (Al), gold (Au), silver (Ag), tungsten (W), platinum (Pt), titanium (Ti), the arbitrary alloys thereof or the likes. In the present embodiment, the metal electrode layer 113 is made of W.

In some embodiments, an optional barrier layer 114 may be formed on the insulating layer 110 prior to the forming of the metal electrode layer 113. In the present embodiment, the barrier layer 114 is formed by a deposition process, such as a LPCVD process. In the present embodiment, the barrier layer 114 is made of titanium nitride (TiN) and disposed between the insulating layer 110 and the metal electrode layer 113.

Then, a planarization process 116, such as a chemical-mechanical planarization (CMP) process, using the dielectric layer 106 as a stop layer may be performed to remove portions of the insulating layer 110, the barrier layer 114 and the metal electrode layer 113 disposed on the dielectric layer 106. The combination of the remaining portions of the metal electrode layer 113, the barrier layer 114 and the insulating layer 110 as well as the first doping region 103 can constitute a memory cell 117 having a MIS vertical stack structure including a top metal electrode layer, a middle insulating layer and a lower silicon electrode layer (see FIG. 1E).

Figure 1F:
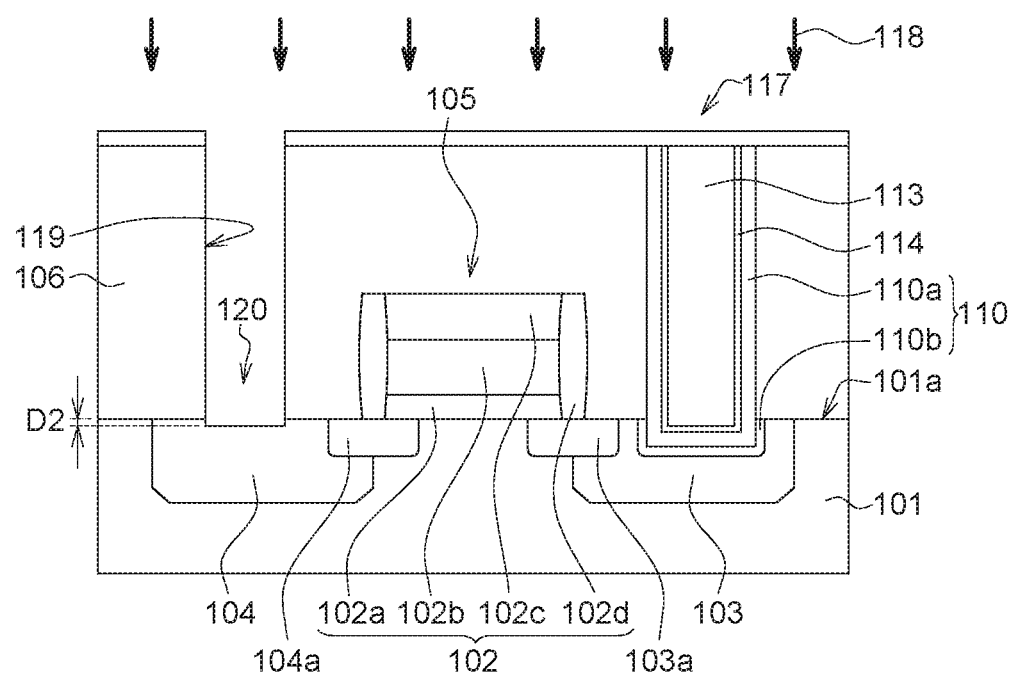

After the memory cell 117 is formed, a second etching process 118 is performed to form a second through hole 119 penetrating the dielectric layer 106 and expose a portion of the second doping region 104 (see FIG. 1F). In some embodiments of the present disclosure, the second etching process 118 may be also a dry etch, such as a RIE, using the top surface 101a of the semiconductor substrate 101 as the etching stop layer. The over etch of the second etching process 118 may result in a recess 120 formed on the top surface of the semiconductor substrate 101 and extending downwards into the second doping region 104. The recess 120 has a depth D2 measured from the top surface 101a of the semiconductor substrate 101 to the bottom of the recess ranging from 10 nm to 25 nm. Of note that, the recess 120 neither vertically nor laterally extends beyond the second doping region 104.

Figure 1G:
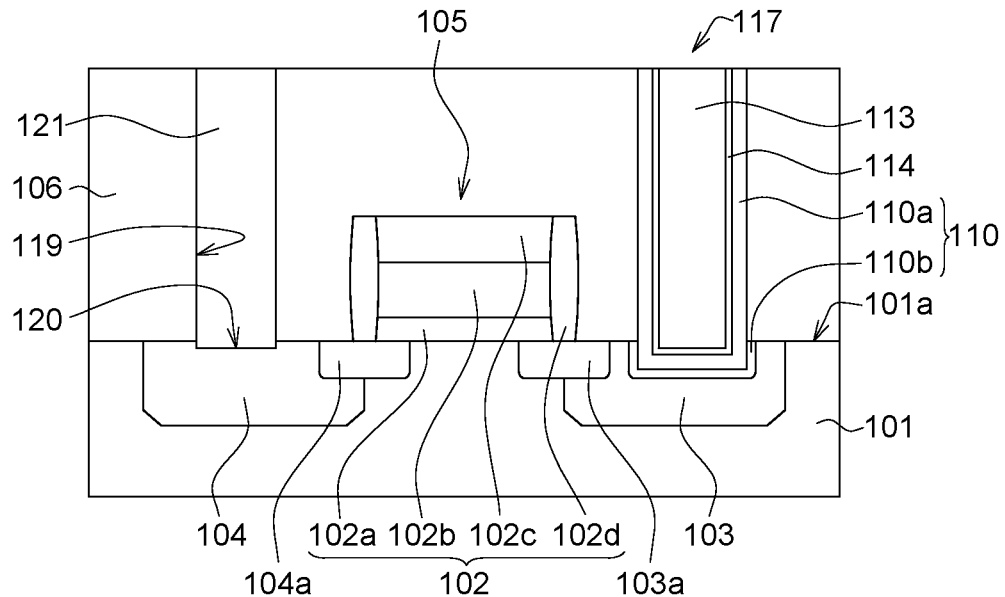

Thereafter, a via plug 121 is then formed in the second through hole 119 and the recess 120 to electrically contact with the second doping region 104 (see FIG. 1G). The method for forming of the via plug 121 includes steps as follows: a metal layer (not shown) is formed on the dielectric layer 106 and the memory cell 117 by a deposition process, such as a LPCVD process, to fill the second through-hole 119 and the recess 120. A planarization process, such as a CMP process, using the dielectric layer 106 as a stop layer may be performed to remove portions of the metal layer, and to remain the portion of the metal layer disposed in the second through-hole 119 and the recess 120. The via plug 121 may be made of a material different from or identical to that for forming the metal electrode layer 113. In the present embodiment, the via plug 121 is made of W.

Figure 1H:
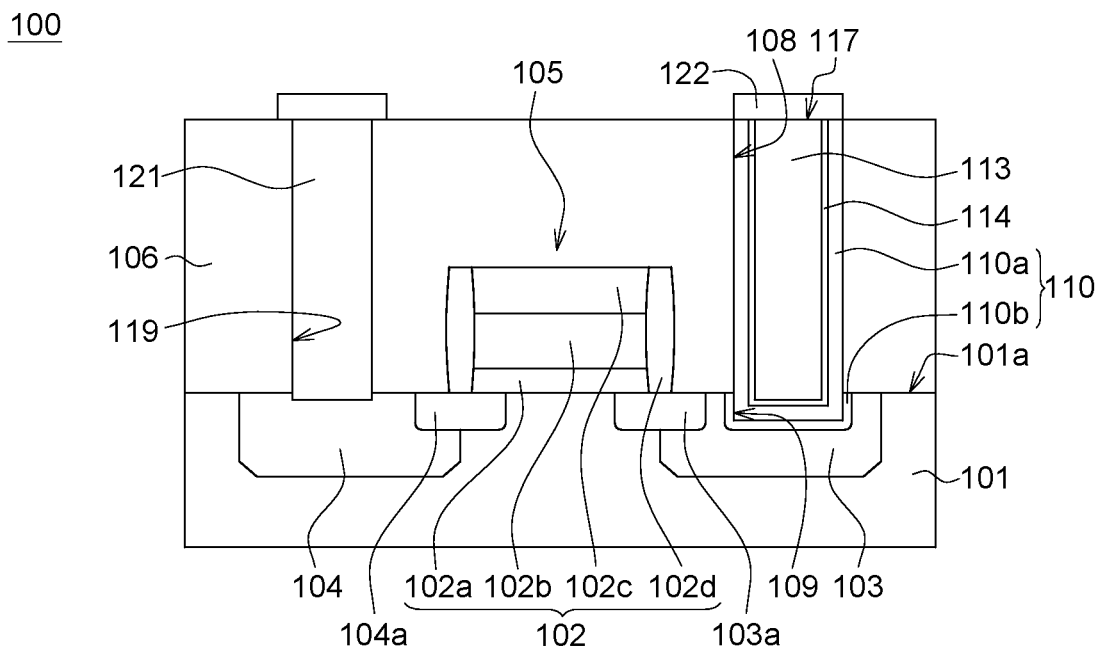

Subsequently, a serious of back-end process (not shown) may be carried out to form a plurality of interconnection lines 122 electrically connected to the via plug 121 and the metal electrode layer 113 respectively, meanwhile the resistive memory device 100 as shown in FIG. 1H is accomplished.

Since the memory cell 117 having a MIS vertical stack structure including a top metal electrode layer, a middle insulating layer and a lower silicon electrode layer is formed in the first through hole 108 and the recess 109 mere by a plurality deposition processes and a planarization process that do not necessitate any additional photolithography/etching steps, thus the memory cell 117 can be scaled down proportionally with the critical dimension shrinkage of the other semiconductor elements, such as the interconnection lines 122, within the same resistive memory device 100, so as to meet the current trend to minimize the size of semiconductor devices.

In addition, because the insulating layer 110 is blanket over the sidewalls 109a and the bottom 109b of the recess 109, a bird beak shaped structure may occur at the corner (the intersection of the sidewalls 109a and the bottom 109b of the recess 109) of the recess 109. When voltages are applied on to the memory cell 117 during the program/erase operation, the electric field intensity may be enlarged at the corner of the recess 109 due to the bird beak shaped structure of the insulating layer 110 formed at the corner of the recess 109. As a result, the electron tunneling efficiency of the memory cell 117 can be increased and the program/erase speed of the memory cell can be accelerated by the "corner effect". The performance of the resistive memory device 100 can be significantly improved.

For example, in an embodiment of the present disclosure, the resistive memory device 100 can have a program/erase speed substantially less than or equal to 50 nanosecond (≤50 ns) that is quicker than that of conventional resistive memory device.

FIGS. 2A to 2H are cross-sectional views illustrating a series of processing structure for fabricating a resistive memory device 200 in accordance with another embodiment of the present invention. The process for fabricating the resistive memory device 100 includes steps as follows:

A semiconductor substrate 201 is firstly provided. In some embodiments of the present disclosure, the semiconductor substrate 201 may be a bulk structure including un-doped poly-silicon, doped poly-silicon (with n-type or p-type dopants) or other elemental semiconductor, such as crystal Ge, compound semiconductor, such as SiC, GaAs, GaP, IP, AsI or SbI, or the arbitrary combinations thereof. In the present embodiment, the semiconductor substrate 201 is a wafer including poly-silicon.

Next, a gate structure 202 is formed on a top surface 201a of the semiconductor substrate 201. At least one ion implantation process is then performed on the surface 201a to form a first doping region 203 and a second doping region 204 extending downwards into the semiconductor substrate 201, wherein the first doping region 203 and the second doping region 204 are disposed adjacent to the gate structure 202 and separated from each other (see FIG. 2A).

In the present embodiment, the gate structure 202 includes a stack of a gate dielectric layer 202a and a gate electrode 202b formed in sequence on the top surface 201a of the semiconductor substrate 201, as well as a spacer 202c formed on the sidewalls of the stack. The first doping region 203 and the second doping region 204 that are disposed adjacent to the gate structure 202 have an n-type conductivity. A transistor 205 is thus formed by the gate structure 202, the first doping region 203 and the second doping region 204, wherein the first doping region 203 and the second doping region 204 can respectively serve as a drain and source of the transistor 205.

Figure 2A:
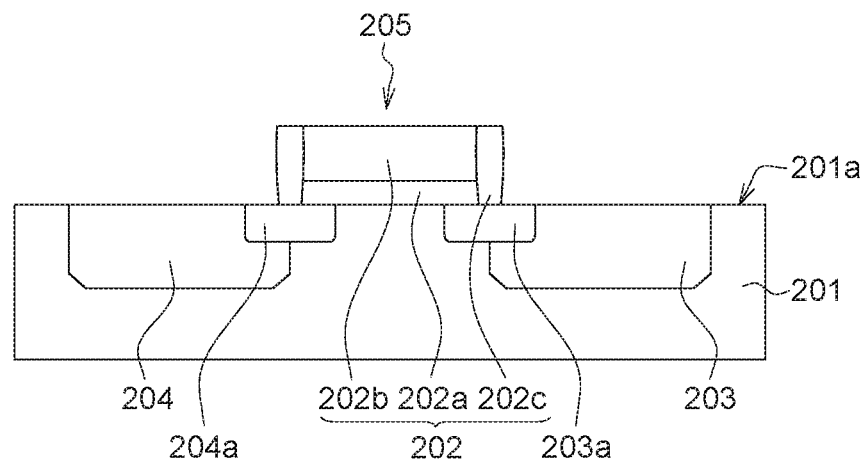
FIGS. 2A to 2H are cross-sectional views illustrating a series of processing structure for fabricating a resistive memory device in accordance with another embodiment of the present invention.
Figure 2B:
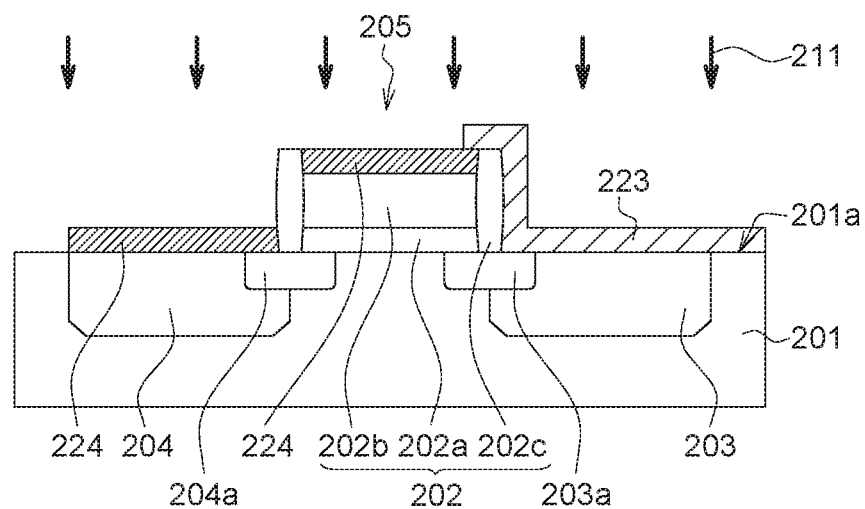

Subsequently, a patterned dielectric protection layer 223 is formed to cover the first doping region 203, and a patterned silicide layer 224 is then formed to cover the gate structure 202 and the second doping region 204 (see FIG. 2B). In some embodiments of the present disclosure, the method for forming the patterned dielectric protection layer 223 includes steps as follows: A resist protective oxide (RPO) layer is firstly formed on the top surface 201a of the semiconductor substrate 201 by a deposition process, such as a LPCVD process, to cover the gate structure 202, the first doping region 203 and the second doping region 204. An etching process is then performed to remove the portions of the RPO layer disposed on the gate structure 202 and the second doping region 204.

The method for forming the patterned silicide layer 224 includes steps as follows: A metal layer (not shown) is firstly formed on the patterned dielectric protection layer 223 the gate structure 202 and the second doping region 204 by a deposition process, such as a LPCVD process. In some embodiments of the present disclosure, the metal layer may be made of W, cobalt (Co), nickel (Ni), Ti or the arbitrary combinations thereof. Next, a rapid thermal anneal (RTA) process 211 is performed to transform the portions of the metal layer disposed on the gate structure 202 and the second doping region 204 into silicide, and the remaining portions of the metal layer are then removed.

Figure 2C:
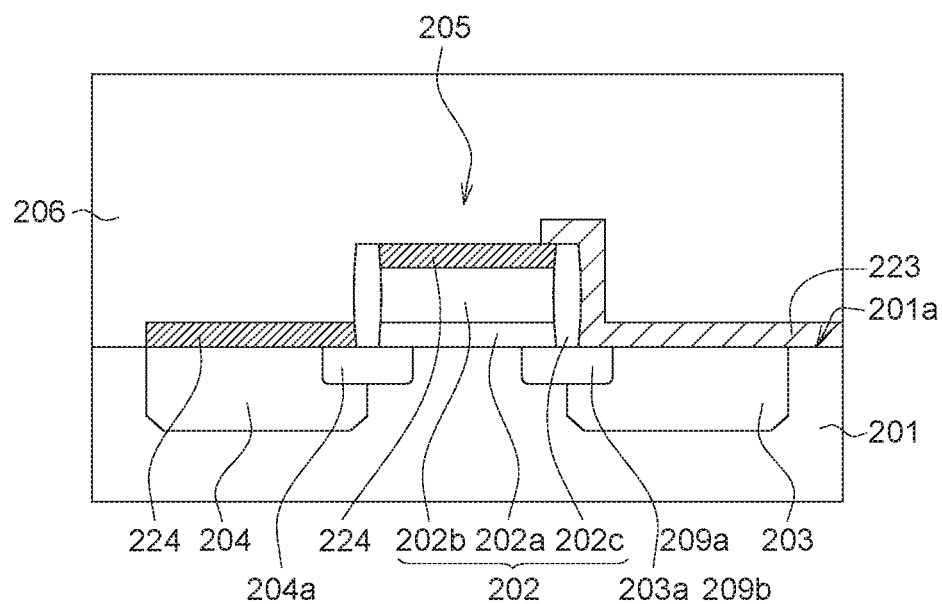
Figure 2D:
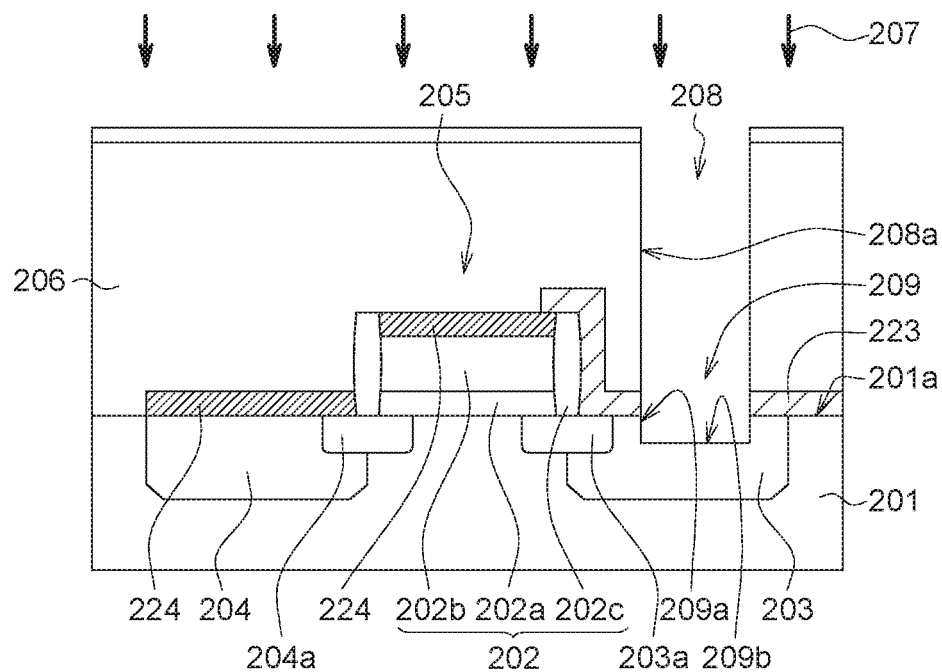

Thereafter, a dielectric layer 206 is formed on the top surface 201a of the semiconductor substrate 201 to cover the patterned dielectric protection layer 223 the gate structure 202 and the second doping region 204 (see FIG. 2C). In some embodiments of the present disclosure, the dielectric layer 206 may be an ILD formed by a deposition process, such as a LPCVD process, or other suitable process. The dielectric layer 206 may be made of material selected from a group consisting of silicon oxide, silicon nitride, silicon oxynitride, silicon-oxycarbide and the arbitrary combinations thereof, or made of other suitable dielectric materials.

Thereafter, a first etching process 207 is performed to form a first through hole 208 penetrating through the dielectric layer 206 and the patterned dielectric protection layer 223, so as to expose a portion of the first doping region 203. Meanwhile, a recess 209 extending downwards into the first doping region 203 from the top surface 201a of the semiconductor substrate 201 is formed by the over etch of the first etching process 207 (see FIG. 2D).

In some embodiments of the present disclosure, the first etching process 207 can be a dry etch, such as a RIE, using the top surface 201a of the semiconductor substrate 201 as the etching stop layer. Since the first through hole 208 and the recess 209 are both formed from the first etching process 207, thus the recess 209 aligns to the first through hole 208. The recess 209 has a depth D1 measured from the top surface 201a of the semiconductor substrate 201 to the bottom 209b of the recess 209 ranging from 5 nm to 15 nm. Of note that, the recess 209 neither vertically nor laterally extends beyond the first doping region 203. In other words, the recess 209 is surrounded by the first doping region 203.

Figure 2E:
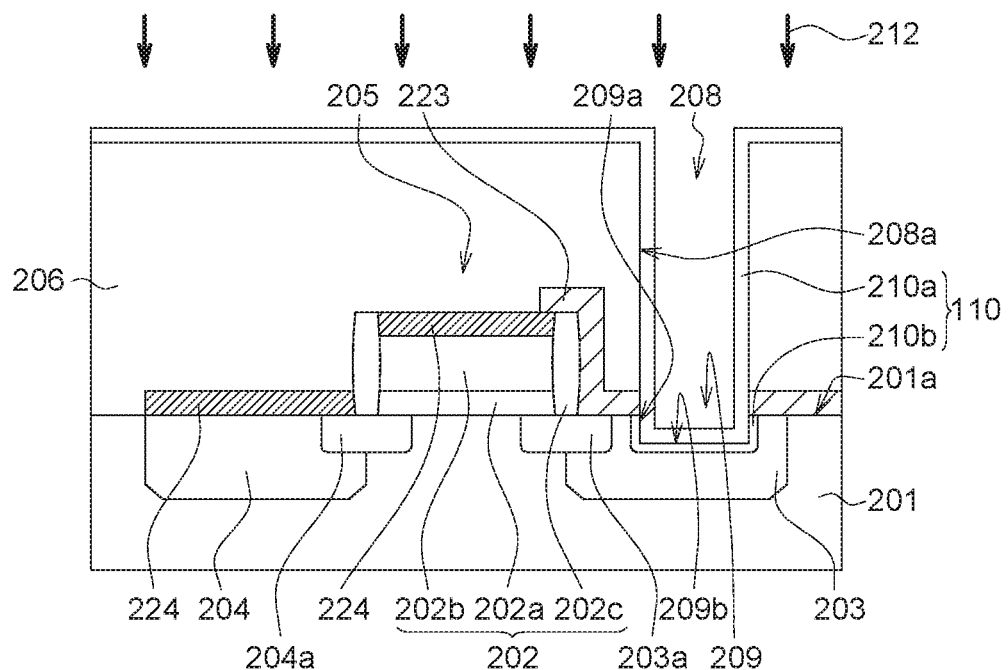

After the forming of the first through hole 208 and the recess 209, an insulating layer 210 is formed in the first through hole 208 and the recess 209 (see FIG. 2E). The method for forming the insulating layer 210 includes steps as follows: A metal layer with a thickness ranging from 5 nm to 10 nm (not shown) is firstly formed on the dielectric layer 206, the sidewalls 208a of the first through hole 208, the sidewalls 209a of the recess 209 and the bottom 209b of the recess 209. A plasma oxidation process 212 is then performed to transform the metal layer into a metal oxide layer 210a.

In some embodiments of the present disclosure, the plasma oxidation process 212 may be carried out in an oxygen-containing atmosphere with a bias ranging from 10V to 50V and a RF power ranging from and 100 W to 300 W for a process time ranging from 5 s to 30 s. The metal oxide layer 210a can be made of $HfO_2$, $TiO_x$, TiON, $Ta_2O_5$, WSiO or the arbitrary combinations thereof.

However, in the case, when the bias of the plasma oxidation process 212 is substantially greater than 100V, a portion of the first doping region 203 used to define the recess 209 may be oxidized to form a silicon oxide layer 210b on the sidewalls 209a and the bottom 209b of the recess 209 and connecting the first doping region 203 with the metal oxide layer 210a. The combination of the metal oxide layer 210a and the silicon oxide layer 210b constitutes the insulating layer 210. In the present embodiment, the plasma oxidation process 212 may be performed by applying a bias ranging from 100V to 180V and a RF power ranging from and 100 W to 300 W for a process time ranging from 5 s to 30 s.

Figure 2F:
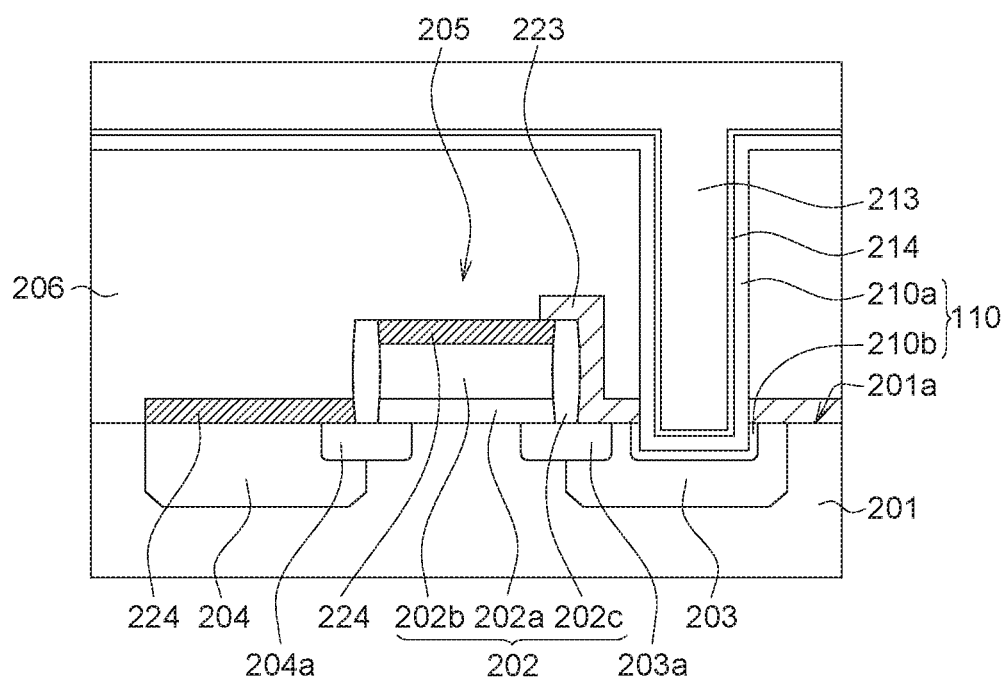
Figure 2G:
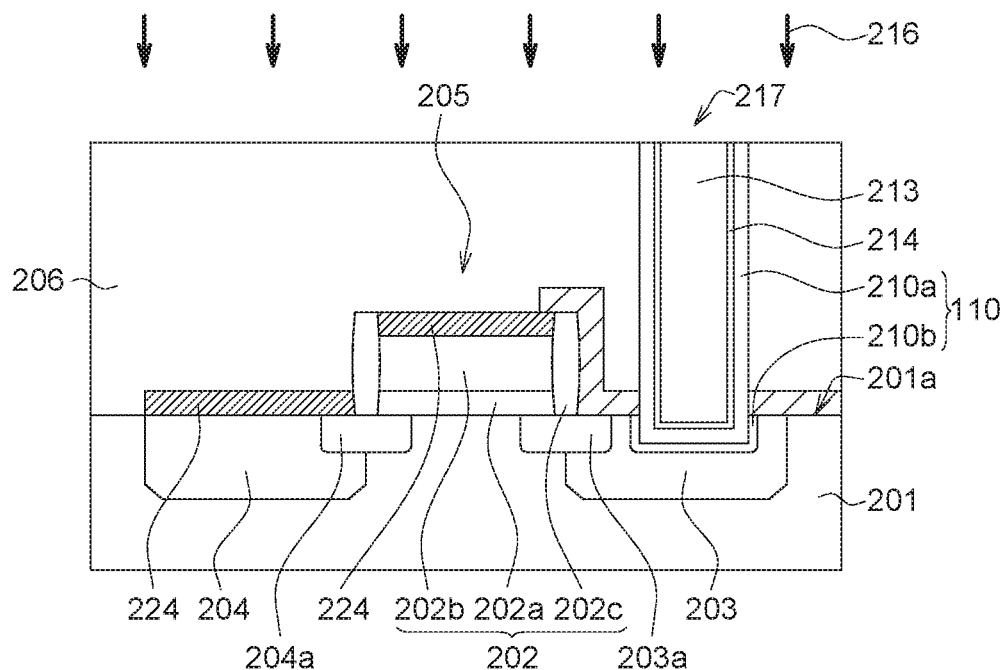

Subsequently, a metal electrode layer 213 is formed on the insulating layer 210 by a deposition process, such as a LPCVD process, to fill the first through hole 208 and the recess 209, and to make the metal electrode layer 213 being isolated from the first doping region 203 by the insulating layer 210 (see FIG. 2F). In some embodiments of the present disclosure, the metal electrode layer 213 may be made of Cu, Al, Au, Ag, W, Pt, Ti, the arbitrary alloys thereof or the likes. In the present embodiment, the metal electrode layer 213 is made of W.

In some embodiments, an optional barrier layer 214 may be formed on the insulating layer 210 prior to the forming of the metal electrode layer 213. In the present embodiment, the barrier layer 214 is formed by a deposition process, such as a LPCVD process. In the present embodiment, the barrier layer 214 is made of TiN and disposed between the insulating layer 210 and the metal electrode layer 213.

Then, a planarization process 216, such as a CMP process, using the dielectric layer 206 as a stop layer may be performed to remove portions of the insulating layer 210, the barrier layer 214 and the metal electrode layer 213 disposed on the dielectric layer 206. The combination of the remaining portions of the metal electrode layer 213, the barrier layer 214 and the insulating layer 210 as well as the first doping region 203 can thus constitute a memory cell 217 having a MIS vertical stack structure including a top metal electrode layer, a middle insulating layer and a lower silicon electrode layer (see FIG. 2G).

Figure 2H:
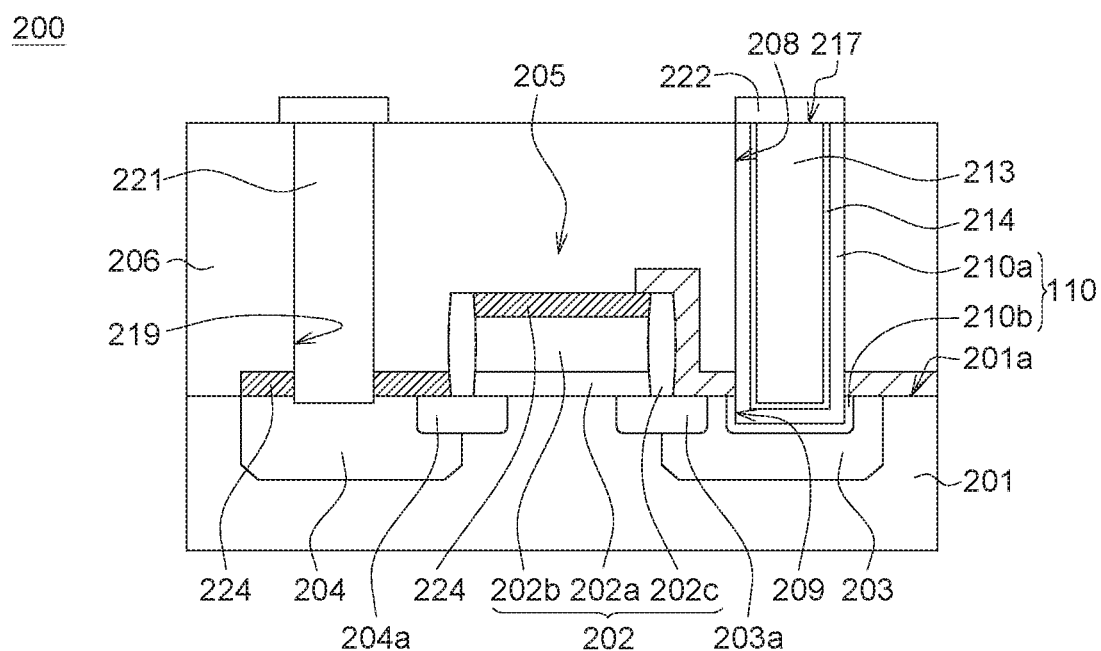

Subsequently, a second etching process 218 is performed to form a second through hole 219 penetrating the dielectric layer 206 and expose a portion of the second doping region 204; a via plug 221 is then formed in the second through hole 219 and the recess 220 to electrically contact with the second doping region 204; and a serious of back-end process (not shown) are carried out to form a plurality of interconnection lines 222 electrically connected to the via plug 221 and the metal electrode layer 213 respectively, meanwhile the resistive memory device 200 as shown in FIG. 2H is accomplished. Since the method for forming the via plug 221 and the metal electrode layer 213 are identical to that described in FIGS. 1G to 1H, thus the materials and process for used for fabricating the same are not redundantly described.

Since the memory cell 217 having a MIS vertical stack structure including a top metal electrode layer, a middle insulating layer and a lower silicon electrode layer is formed in the first through hole 208 and the recess 209 mere by a plurality deposition processes and a planarization process that do not necessitate any additional photolithography/etching steps, thus the memory cell 217 can be scaled down proportionally with the critical dimension shrinkage of the other semiconductor elements, such as the interconnection lines 222, within the same resistive memory device 200, so as to meet the current trend to minimize the size of semiconductor devices.

In addition, because the insulating layer 210 is blanket over the sidewalls 209a and the bottom 209b of the recess 209, a bird beak shaped structure may occur at the corner of the recess 209. When voltages are applied on to the memory cell 217 during the program/erase operation, the electric field intensity may be enlarged at the corner of the recess 209 due to the bird beak shaped structure of the insulating layer 210 formed at the corner of the recess 209. As a result, the electron tunneling efficiency of the memory cell 217 can be increased and the program/erase speed of the memory cell can be accelerated by the "corner effect". The performance of the resistive memory device 200 can be significantly improved.

In accordance with the aforementioned embodiments of the present disclosure, a resistive memory device, the method for fabricating the same and the applications thereof are provided. A dielectric having a through hole is firstly formed on a top surface of a semiconductor substrate, wherein a portion of the top surface is exposed from the through hole. A recess is then formed on the exposed portion of the top surface and extending downwards into the semiconductor substrate. Next, a self-aligned structure including an insulating layer and a metal electrode layer formed sequentially in the through hole and the recess, whereby a memory cell having a metal-insulator-semiconductor (MIS) vertical stack structure constituted by the underlying semiconductor device, the insulating layer and the top metal electrode layer is then implemented.

Since the forming of the insulating layer/metal electrode layer self-aligned structure does not require an additional photolithography/etching process for patterning the same, thus the memory cell can be scaled down proportionally with the critical dimension shrinkage of the other semiconductor elements within the same resistive memory device, so as to meet the current trend to minimize the size of semiconductor devices. In addition, because the insulating layer extends downwards into the recess to form a corner beak in the semiconductor substrate, the program/erase speed of the memory cell can be accelerated by corner effect resulted from the corner beak of the insulating layer formed in the edge of the recess. The performance of the resistive memory device can be significantly improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a resistive memory device, comprising:
   providing a semiconductor substrate having a gate structure, a first doping region and a second doping region, wherein the gate structure is formed on a top surface of the semiconductor substrate; the first doping region and the second doping region are formed in the semiconductor substrate, adjacent to the gate structure and separated from each other;
   forming a dielectric layer on the top surface to cover on the first doping region and the second doping region;
   performing a first etching process to form a first through-hole in the dielectric layer, so as to expose a portion of the first doping region, meanwhile, to form a recess extending downwards into the first doping region from the top surface;
   forming an insulating layer in the first through-hole and the recess;
   forming a metal electrode layer on the insulating layer to make the metal electrode layer being isolated from the first doping region by the insulating layer;
   performing a second etching process to form a second through-hole in the dielectric layer to expose a portion of the second doping region; and
   forming a via plug electrically contacting to the second doping region in the second through-hole.

2. The method according to claim 1, prior to the forming of the dielectric layer, further comprising:
   forming a patterned dielectric protection layer disposed on the first doping region; and
   forming a patterned silicide layer to cover the gate structure and the second doping region.

3. The method according to claim 2, wherein the forming of the patterned silicide layer comprises a rapid thermal anneal (RTA) process.

4. The method according to claim 1, wherein the forming of the insulating layer comprises:
  performing a plasma oxidation process to form a metal oxide layer on at least one sidewall of the first through-hole; and
  forming a silicon oxide layer on a sidewall and a bottom of the recess and connecting the first doping region with the metal oxide layer.

5. The method according to claim 1, wherein the recess has a depth measured from the top surface to a bottom of the recess ranging from 5 nm to 15 nm.

6. The method according to claim 1, wherein the semiconductor substrate comprises Si; the insulating layer comprises TiON; and the metal electrode layer comprises W.

7. The method according to claim 1, prior to the forming of the metal electrode layer, further comprising steps of forming a barrier layer on the insulating layer.

\* \* \* \* \*